United States Patent
Mohseni

(10) Patent No.: US 8,445,188 B2
(45) Date of Patent: May 21, 2013

(54) PROCESS FOR FORMATION OF HIGHLY UNIFORM ARRAYS OF NANO-HOLES AND NANO-PILLARS

(75) Inventor: Hooman Mohseni, Wilmette, IL (US)

(73) Assignee: National Science Foundation, Arlington, VA (US)

( * ) Notice: Subject to any disclaimer, the term of this patent is extended or adjusted under 35 U.S.C. 154(b) by 811 days.

(21) Appl. No.: 12/584,897

(22) Filed: Sep. 14, 2009

(65) Prior Publication Data

US 2010/0080954 A1 Apr. 1, 2010

Related U.S. Application Data

(60) Provisional application No. 61/192,321, filed on Sep. 17, 2008.

(51) Int. Cl.
*G03F 7/20* (2006.01)

(52) U.S. Cl.
USPC .......................... 430/324; 430/325

(58) Field of Classification Search
None
See application file for complete search history.

(56) References Cited

U.S. PATENT DOCUMENTS 5,669,800 A * 9/1997 Ida et al. .................. 445/25

FOREIGN PATENT DOCUMENTS

CN 101058403 A * 10/2007

OTHER PUBLICATIONS

Abstract of CN 101058403 A (Oct. 2007).*
Computer-generated translation of CN 101058403 A (Oct. 2007).*
H. Masuda et al., Photonic band gap in anodic porous alumina with extremely high aspect ratio formed in phosphoric acid solution, J. Appl. Phys., 39, 1039-1041, 2000.
S.M. Weekes et al., Fabrication of large-area ferromagnetic arrays using etched nanosphere lithography, Langmuir, 20, 11208-11212, 2004.
W.L. Chiu et al., Sub-wavelength texturing for solar cells using interferometric lithography, Adv. Sci. Technol., 51, 115-120, 2006.
N. Gadegaard et al., Applications of nanopatterning to tissue engineering, Microelectron Eng., 83, 1577-1581, 2006.
J.C. Hulteen et al., Nanosphere lithography: A materials general fabrication process for periodic particle array surfaces, J. Vac. Sci. Technol. A, 13, 1553-1558, 1995.
Z. Chen et al., Photonic nanojet enhancement of backscattering of light by nanoparticles: A potential novel visible-light ultramicroscopy technique, Opt. Express, 12, 1214-1220, 2004.
See for example Shipley 1800 series photoresist development curves at http://cmi.epfl.ch/materials/Data_S1800.pdf, (2009).
R. Micheletto et al., A simple method for the production of a two-dimensional ordered array of small latex particles, Langmuir, 11, 3333-3336 1995.

* cited by examiner

*Primary Examiner* — John A. McPherson
(74) *Attorney, Agent, or Firm* — Klintworth & Rozenblat IP LLC

(57) ABSTRACT

A photolithography method of patterning photoresist involves disposing a two-dimensional array of focusing particles of spherical or other shape on the photoresist and illuminating the particles on the photoresist to generate deep, sub-wavelength patterns on the photoresist. When developed, a positive photoresist layer generates a two-dimensional array of micro- or nano-holes on the developed photoresist. When developed, a negative photoresist layer generates a two-dimensional array of micro- or nano-pillars on the developed photoresist.

11 Claims, 9 Drawing Sheets

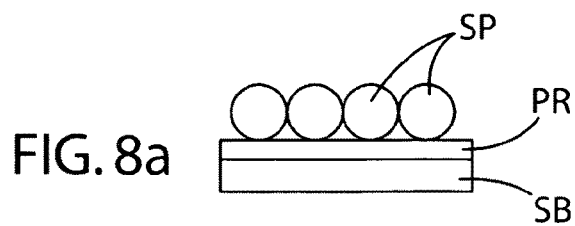
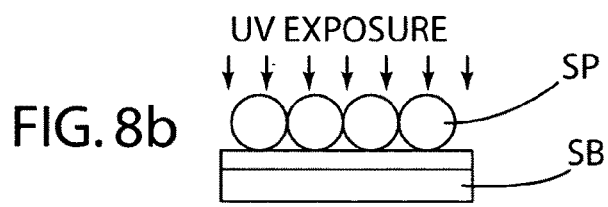
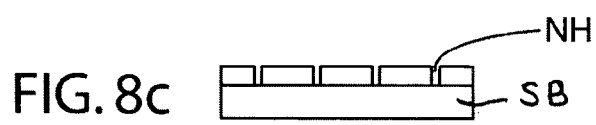
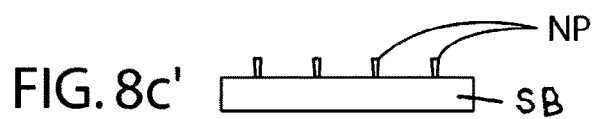
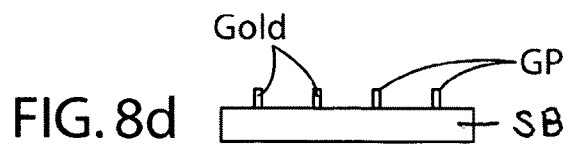
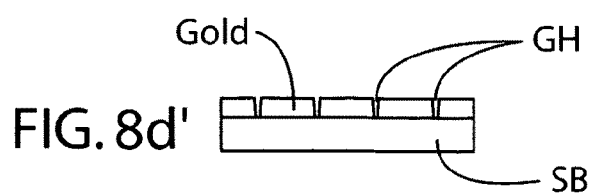

PROCESS FOR FORMATION OF HIGHLY UNIFORM ARRAYS OF NANO-HOLES AND NANO-PILLARS

This application claims priority and benefits of U.S. provisional application Ser. No. 61/192,321 filed Sep. 17, 2008, the disclosure of which is incorporated herein by reference.

CONTRACTUAL ORIGIN OF THE INVENTION

This invention was made with government support under Grant No. ECCS-0621887 awarded by the National Science Foundation. The Government has certain rights in the invention.

FIELD OF THE INVENTION

The present invention relates to photolithography methods for patterning photoresist and, more particularly, to a photolithography method using a two-dimensional array of focusing particles on photoresist to produce deep, sub-wavelength patterns thereon, which in turn can be used to form metal, semiconductor, and insulator layers having a uniform two-dimensional array of micro- or nano-holes or micro- or nano-pillars depending upon whether the photoresist is a positive or negative photoresist.

BACKGROUND OF THE INVENTION

There is an increasing demand for high throughput and parallel nano-fabrication techniques. In particular, there is a high demand for a low-cost process capable of producing highly uniform arrays of nano-pillar and nano-holes, since these patterns have found wide range of applications in many devices such as solar cells, photodetector, surface plasmonics, photonic crystals, memory devices, nano-filtration, fuel cells, and artificial kidneys. Conventional photolithography techniques cannot satisfy the small dimension requirements in many of these applications, due to the light source's wavelength limit1. Techniques such as x-ray, electron-beam, focused ion beam and nano-imprint lithography can achieve the desired resolution, but are either slow or expensive for fabrication over large areas. Nanosphere lithography (NSL) is an approach that uses planar arrays of micro/nanospheres as a lithography mask to generate nano-scale arrays on the substrate. However, there are several limitations associated with this method. First is that the monolayer of spheres can always contain dislocations resulting in agglomerations of particles after metal evaporation and prevent successful lift-off. Second, the size and spacing of the holes are coupled, and hence these properties cannot be independently controlled. Finally, NSL requires spheres to be formed directly on the substrate surface, which is not possible for many materials.

SUMMARY OF THE INVENTION

The present invention involves a photolithography method of patterning photoresist by disposing a two-dimensional array of focusing particles on the photoresist and illuminating the particles on the photoresist with UV, DUV or other light to which the photoresist is sensitive. Practice of the invention generates deep, sub-wavelength patterns on the photoresist, which can be a conventional positive or negative photoresist.

In an illustrative embodiment of the invention, the method includes disposing a two-dimensional array of substantially spherical particles on a photoresist layer on a substrate, illuminating the particles on the photoresist layer while focusing the illumination through the particles to respective underlying regions of the photoresist layer with each region forming a micro- or nano-feature having a sub-wavelength dimension that is less than the wavelength of the illumination. The sub-wavelength dimension is about 0.6 or less of the wavelength of the illumination.

The particles preferably are substantially spherical particles such that each underlying area of the photoresist forms a micro- or nano-pillar region or feature having a sub-wavelength diameter dimension that is less than the wavelength of the illumination. When the photoresist layer comprises a positive photoresist, developing of the photoresist leaves a two-dimensional array of micro- or nano-holes on the developed photoresist. When the photoresist layer comprises a negative photoresist, developing of the photoresist leaves a two-dimensional array of micro- or nano-pillars, which can be provided with an undercut profile, on the developed photoresist. The substantially spherical particles can have a diameter in the range of 0.5 microns to 5 microns and can comprise silica or polystyrene (PS) self assembled on the photoresist for purposes of illustration.

Practice of the method of the invention provides accurate and independent control of the dimension and lattice period of the patterned photoresist areas to, in turn, allow similar control of the dimension and the lattice period of nano-holes or nano-pillars formed in metal, semiconductor, and/or insulator layers using the developed photoresist. For example, the method can further include the step of depositing a material such as a metal, semiconductor, and/or electrical insulator on the developed photoresist layer and then removing the developed photoresist layer by, for example, a lift-off or other technique to leave one or more layers of metal, semiconductor and/or insulator having a two-dimensional array of micro- or nano-holes or micro- or nano-pillars, for example, having a hole or pillar diameter of 250 nm or less. Moreover, such a layer having a two-dimensional array of micro- or nano-holes can be used as a mask for etching a substrate or another layer to provide a uniform array of micro- or nano-holes therein.

The present invention thus provides a combination of a photoresist and a two-dimensional array of focusing particles on the photoresist that can be used to generate a highly uniform two-dimensional array of micro- or nano-features on the photoresist using UV, DUV or other light or radiation in a low cost and high-throughput manner. A uniform two dimensional array of nano-holes or nano-pillars having sub-100 nm diameter dimension can be generated using a UV light source with a 200 nm wavelength for purposes of illustration.

Other advantages and features of the present invention will become apparent from the following detailed description taken with the following drawings.

BRIEF DESCRIPTION OF THE DRAWINGS

FIGS. 1a-1d is a schematic illustration of a method embodiment of the invention for fabrication of a periodic two-dimensional array of nano-features on photoresist, wherein FIG. 1a shows photoresist deposited on a substrate, FIG. 1b shows a monolayer of silica or PS focusing microspheres (focusing particles) formed on the top of the photoresist in a two-dimensional HCP array, FIG. 1c shows the step of UV light illumination of the photoresist covered by the monolayer of HCP microspheres, and FIG. 1d shows the sub-wavelength patterned regions of photoresist after removal of the microspheres wherein the regions form a two-dimensional array of subwavelength nano-pillar features on the photoresist.

FIGS. 8a; 8b; 8c, 8c'; and 8d, 8d' schematically show a method of nanosphere lithography for fabricating nanostructures where FIGS. 8c, 8d relate to using a positive photoresist and FIGS. 8c', 8d' relate to using a negative photoresist.

FIG. 13a shows an array of hexagonally distributed uniform nanoposts of Ti/Au, while

DETAILED DESCRIPTION OF THE INVENTION

Figure 1:
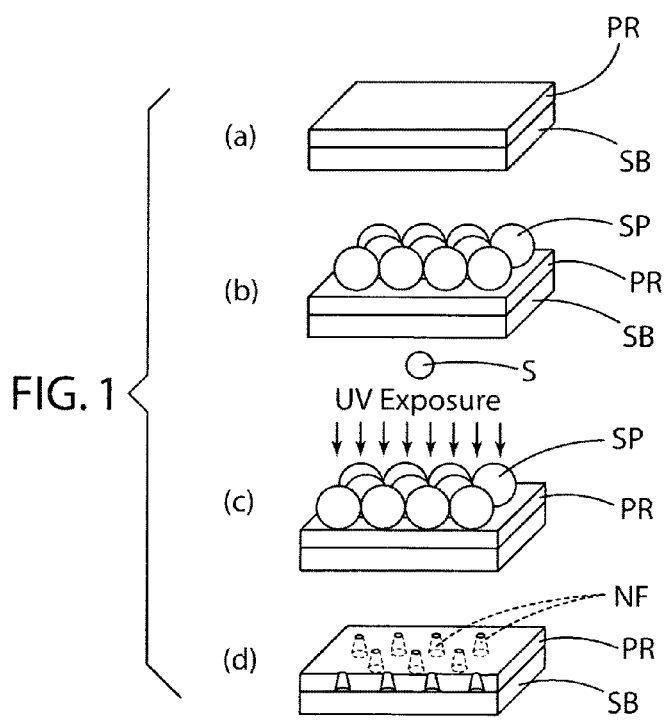

The present invention involves a photolithography method of patterning photoresist on a substrate by disposing a two-dimensional array of focusing particles on the photoresist and illuminating the particles on the photoresist with UV, DUV or other light. Practice of the invention generates deep, sub-wavelength patterns of micro- or nano-features on the photoresist, which can be a conventional positive or negative photoresist. The two-dimensional array of sub-wavelength pattered features has a periodicity corresponding substantially to that of the particle array with all of the pattered features being generated simultaneously. The focusing particles preferably are substantially spherical particles, although other particle shapes than spherical may be used in practice of the invention provided that the focusing particles provide a respective focused light beam on an respective underlying region of the photoresist with each region forming an exposed micro- or nano-feature having a sub-wavelength dimension that is less than the wavelength of the illumination. The sub-wavelength dimension of the exposed region of the photoresist is about 0.5 or less of the wavelength of the illumination for purposes of illustration. The illumination can include, but is not limited to, UV, deep UV (DUV), or other light or radiation. For purposes of illustration and not limitation, UV light having a wavelength of 200 to 500 nm can be used. The time of exposure to UV light typically is short enough so as not to expose the photoresist except at the focused regions beneath the focusing particles.

The shape and optical properties (e.g. optical index values) of the particle material are selected such that the particles provide the described focusing effect. The substantially spherical particles can have a micro- or nano-diameter in the range of 0.5 microns to 5 microns for purposes of illustration. The focusing particles do not have to be uniform in size (e.g. uniform diameter for spherical particles) within a batch since the size of the underlying exposed photoresist regions is a weak function of particle size. As a result, the focusing particles can have varying sizes within a particle batch.

The Examples set forth describe use of silica and polystyrene (PS) substantially spherical focusing micro-particles for purposes of illustration and not limitation since particles comprised of other materials and shapes can be used. When substantially spherical focusing particles are used, the underlying regions of the photoresist exposed to the focused light each form a micro- or nano-pillar region or feature having a sub-wavelength diameter dimension that is less than the wavelength of the illumination. When the photoresist layer comprises a positive photoresist, developing of the photoresist leaves a two-dimensional array of micro- or nano-holes on the developed photoresist. When the photoresist layer comprises a negative photoresist, developing of the photoresist leaves a two-dimensional array of micro- or nano-pillars on the developed photoresist. Substantially spherical focusing particles are preferred in certain embodiments of the invention because they can be self-assembled to form a uniform two-dimensional HCP (hexagonal close packed) array on the photoresist. The substrate on which the photoresist resides can be a commercially available glass slide, silicon, GaAs, or any other suitable substrate.

An illustrative method embodiment of the invention for patterning photoresist involves disposing a two-dimensional array of substantially spherical or other shape particles on a photoresist layer on a substrate, illuminating the particles on the photoresist layer while focusing the illumination through the particles to respective regions of the photoresist layer beneath the particles with each region forming a sub-wavelength micro- or nano-pillar or post having a diameter dimension that is less than the wavelength of the illumination, and developing the photoresist after or before the focusing particles are removed. Substantially spherical particles can be self-assembled into a uniform two dimensional HCP array using an aqueous dispersion of the particles after treating the photoresist to be hydrophilic (rather than hydrophobic) as described below.

Practice of the method of the invention provides accurate and independent control of the dimension and lattice period of the patterned photoresist regions. The periodicity of the micro- or nano-holes or micro- or nano-pillars of the developed photoresist is controllable by varying the diameter of the spherical focusing particles. The diameter of the holes or pillars is controllable by controlling exposure time and development time of the photoresist. Practice of the method of the invention provides accurate and independent control of the dimension and lattice period of the patterned photoresist regions to, in turn, allow similar control of the dimension and the lattice period of holes or pillars formed in metal, semiconductor, and/or electrical insulator layer(s) using the developed photoresist. For example, the method can further include the step of depositing a material such as a metal, semiconductor, and/or electrical insulator on the developed photoresist layer and then removing the developed photoresist layer by, for example, a lift-off or other technique to leave one or more layers of metal, semiconductor and/or insulator having a two-dimensional array of micro- or nano-holes or micro- or nano-pillars. For example, a metal, semiconductor, and/or insulator material can be EB evaporated in a PVD chamber by applying periodic power to the EB evaporator (to avoid overheating of the photoresist to permit subsequent precision liftoff) and deposited onto the developed photoresist followed by removal of the developed photoresist in a suitable liftoff solution, such as N-methyl-pyrolidinone (NMP), with ultrassonication. Moreover, such a layer having a two-dimensional array of micro- or nano-holes can be used as a mask for dry or wet-based etching a substrate or another layer to transfer or provide a uniform array of similar holes therein.

The invention can be practiced to economically and quickly generate a large area of uniform micro- or nano-holes or pillars (posts) in different solid metal, semiconductor, insulator layers for potential use in electronic devices, optical devices, biological sensors, ion filtration devices and others.

Illustrative Embodiment

Referring to FIGS. 1a through 1d, an illustrative method embodiment of the invention is shown for patterning photoresist wherein FIG. 1a shows photoresist PR which has been deposited (e.g. by spin-on deposition) on a substrate SB, FIG. 1b shows a monolayer of silica or polystyrene focusing micro-spheres SP comprising focusing particles formed on the top of the photoresist in a two-dimensional HCP array, FIG. 1sc shows the step of UV light illumination by UV light source S of the photoresist covered by the monolayer of HCP microspherical focusing particles wherein the particles focus focusing the UV illumination through the particles to respective underlying regions of the photoresist layer with each region forming a sub-wavelength micro- or nano-pillar or post NF having a diameter dimension that is less than the wavelength of the illumination, and FIG. 1d shows the sub-wavelength patterned regions of photoresist after removal of the microspheres and before photoresist development wherein the regions form a two-dimensional array of sub-wavelength nano-pillar features on the photoresist. With respect to FIG. 1c, a quartz filter (not shown) is positioned above the focusing particles and below the UV light source (e.g. about 2 mm above the focusing particles) to reduce the intensity of the UV light propagating through without substantially changing the spectrum of the wavelength. The quartz filter can be a commercially available filter of square shape (2 mm thick and 4×4 cm square) and has a calibrated transmission coefficient (e.g. 40%) at the UV wavelength used.

Figure 2:
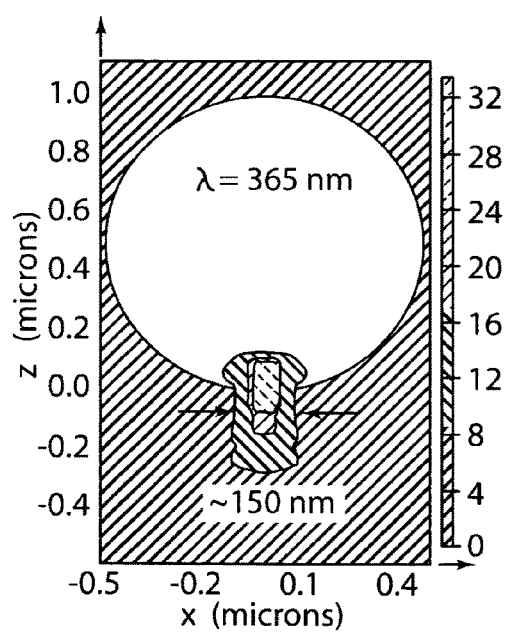
FIG. 2 shows the 3D-FDTD simulations of light's intensity profile for a silica microsphere with a diameter of one micron for a conventional UV lithography i-line (λ=365 nm).

Referring to FIG. 2, this figure illustrates the focusing effect of a microspherical silica particle of one (1) micron diameter. In particular, FIG. 2 shows the 3D-FDTD (full three-dimensional finite difference time domain) simulations of light's intensity profile for a silica microsphere with a diameter of one (1) micron for a conventional UV lithography i-line ($\lambda$=365 nm). The focused light's intensity is about 30 times as strong as the input light and the full width at half-maximum (FWHM) of the focused light is about 150 nm, smaller than half of the wavelength of the impinging light.

Figure 3:
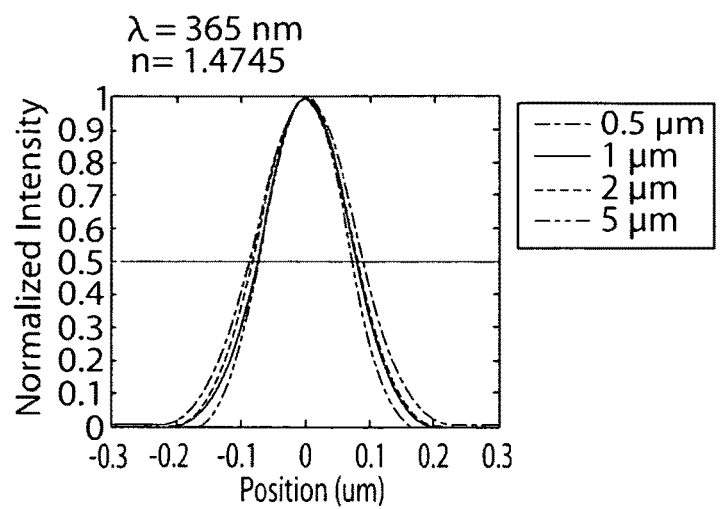
FIG. 3 shows normalized light intensity cross-section versus the position away from the center of the sphere located at 0x-axis as determined by 3D-FDTD simulations of the electrical field profile for silica micro/nanospheres with diameters of D=0.5, 1, 2, and 5 μm at λ=365 nm and shows a very small change of the beam FWHM despite a 10-time change in the sphere diameter.

FIG. 3 shows normalized light intensity cross-section determined by 3D-FDTD simulations of the electrical field profile for silica micro/nanospheres with diameters of D=0.5, 1, 2, and 5 μm at $\lambda$=365 nm. The normalized light intensity cross-section shows a very small change of the beam FWHM despite a 10-time change in the sphere diameter. This means that the variation of the FWHM of the focused light is about 0.6% of the change of sphere's diameter. Similar simulation results were also be obtained for polystyrene spheres. FWHM is a good measure of the photoresist exposure, since the developing rate usually changes by almost an order of magnitude for a 50% optical intensity change around the photoresist threshold dose. This illustrates that 3D-FDTD calculations show that the beam waist is a very weak function of the sphere diameters and hence extremely uniform pattern size can be achieved even for relatively poor sphere size uniformity.

Figure 4:
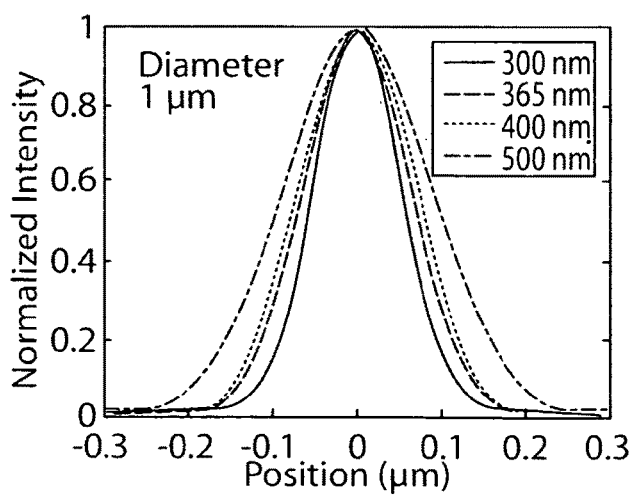
FIG. 4 shows the normalized intensity of the focused light versus the position away from center of the sphere located at 0x-axis with different wavelengths of UV light.

FIG. 4 shows normalized light intensity cross-section after being focused by silica microspheres of one (1) micron diameter with different wavelengths of UV light from 300 to 500 nm. FIG. 4 shows that the FWHM values of the focused light decrease as the wavelength of the impinging light is reduced such that smaller features can be produced on the photoresist by exposure to UV light of smaller wavelengths.

Development of the exposed photoresist can be achieved using commercially available developers using a beaker in which the exposed sample was placed. The beaker includes small drilled developer flow rate control holes at the bottom. The exposed sample is placed in the beaker and rinsed for a time with developer introduced into the top of the beaker and flowing out of the bottom holes. The developed sample was easily transferred after development. Since the diameter of the photoresist nano-pillars at their bottom can be below 100 nm, the development process is controlled using the drilled flow rate control holes to accurately control the flow of the developer and the development time to ensure that the photoresist nano-pillars remain upstanding and are not over-developed as to fall over.

EXAMPLE 1

GaAs substrates were prepared with two kinds of commonly used photoresists; namely, AZ 5214-E and Shipley 1805 available from Clariant Corp. and Shipley Co. respectively. The photoresists were applied to a thickness of 1 um and 500 nm, respectively. All process steps were performed in a class 100 clean-room. Two types of spheres, silica and polystyrene (PS), were used to form hexagonal close packing (HCP) arrays on top of the photoresists. A 10 wt. % aqueous suspension of transparent silica or polystyrene spheres of 0.97 um diameter. The silica or PS microspheres both were purchased from Bangs Laboratory, Inc. The silica and PS microspheres had uniform diameters of about 0.97 micron (typical size standard deviation is 5-10%). Before usage, the aqueous suspension was diluted by deionized water down to 0.1 wt. % for both types of the spheres. Higher concentration of the spheres formed multi-layers of microspheres and a low concentration would not be sufficient to form a complete monolayer layer.

Figure 5:
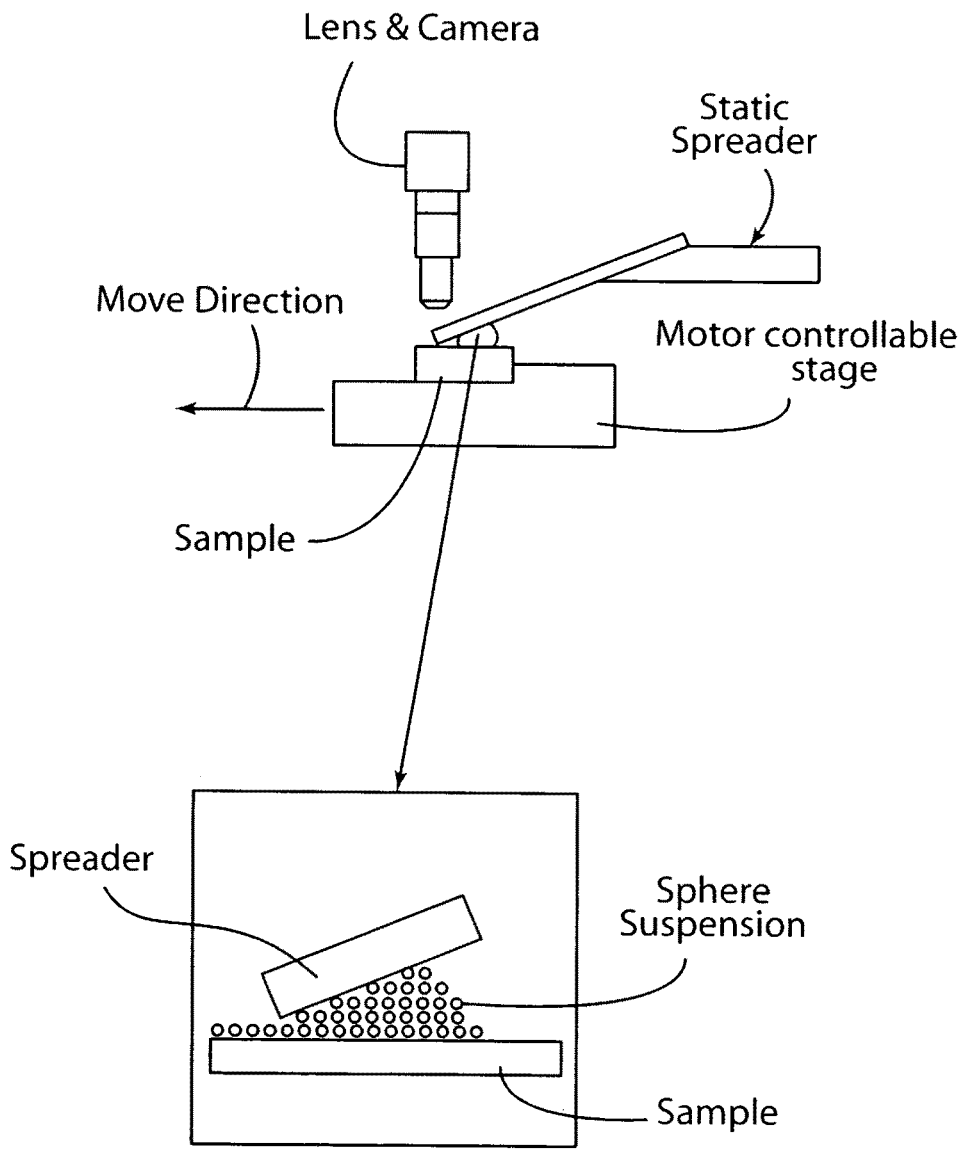
FIG. 5 illustrates a spreader device for forming a large area of HCP microspherical particles as an HCP monolayer on the photoresist layer with the lower portion of the figure showing an enlarged view of the spreader and sphere suspension on the sample.

The fabrication process is schematically illustrated in FIGS. 1a-1d. Both photoresists were spun onto GaAs substrates at 5000 rpm for 1 min, and soft baked for 90 seconds at 90° C. After soft bake, the photoresist-covered samples were dipped into AZ-300 MIF developer solution for a few seconds. This step made the photoresist surface hydrophilic enough to promote formation of a monolayer of HCP silica or PS microspheres of a diameter of about 0.97 μm directly on top of the photoresist. To form a good monolayer, the effects of different concentrations of the spheres, the amount of the sphere suspensions added, the evaporation rates of water, and different tilt angles were studied. A large area of HCP monolayer of either silica spheres or of PS spheres was formed on the photoresist by self-assembly of the microspherical particles using the device of FIG. 5. The spreading device was placed on an optical table in the UV protection clean room. A high-resolution electrical motor provided the movement of the motor-controllable stage with the sample on it. The method utilizes the convective force of water from the spreader to push the spheres into a close monolayer along the meniscus of the sphere suspension as the stage moves. In the area of the meniscus, the thin water layer is easily evaporated and the microspheres stay on the surface of the photoresist as a self-assembled two-dimensional HCP array of several millimeters in the x and y directions.

Next, the samples were UV exposed using a conventional photolithography tool (Quintel Q-4000) at a lamp power of about 11.4 mW/cm$^2$ and center wavelength of 400 nm for about 0.8 second. The short time was not enough to expose the photoresist except at the focused regions beneath the microspheres. The silica microspheres were then removed by dipping the sample into hydrofluoric acid for 30 seconds, while sonication was used to remove the PS microspheres from the exposed photoresist. The photoresists were developed in AZ-300 MIF developer for about 30 seconds, rinsed by deionized water, and dried by nitrogen.

Figure 6A:
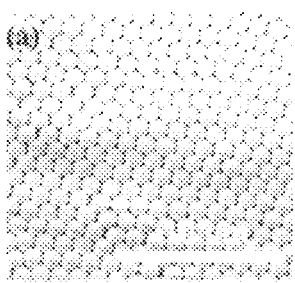
FIG. 6a shows a scanning electron micrograph (SEM) image of a typical monolayer of silica spheres with diameter of about 0.97 μm formed on the top of the photoresist.
Figure 6B:
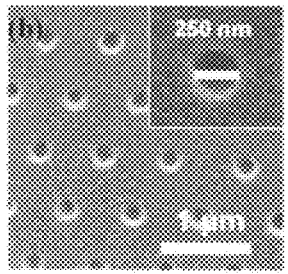
FIG. 6b shows the top view of SEM images of the developed samples with the inset showing a single hole.
Figure 6C:
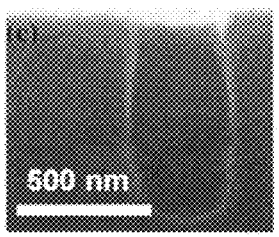
FIG. 6c is the cross-section SEM image of a hole in AZ5214 photoresist. It shows a high aspect ratio, which can be utilized for demanding lift-off and deep dry etching processes.
Figure 6D:
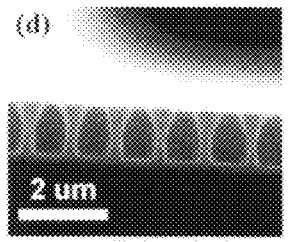
FIG. 6d shows that the process can produce holes with negative sidewall slopes for a more aggressive lift-off process.
Figure 6E:
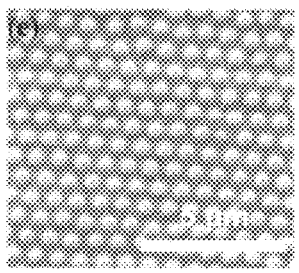
FIG. 6e shows a SEM top image of photoresist pillars.
Figure 6F:
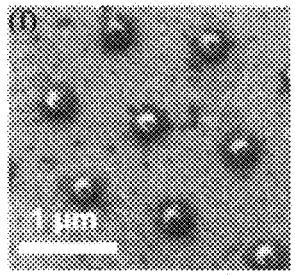
FIG. 6f shows an enlarged SEM image of photoresist pillars.

FIG. 6a shows the SEM image of a typical monolayer of silica spheres with d~0.97 um formed on the top of the photoresist. FIG. 6b shows the top view of SEM images of the developed samples. The minimum diameter of the holes is about 250 nm. The ratio of the feature size to the wavelength used is about 0.625. The hole lattice array has a periodicity of 0.97 um, almost identical to the diameter of the spheres. FIG. 6c is the cross-section image of a hole in AZ5214 photoresist. It shows a high aspect ratio, which can be utilized for demanding lift-off and deep dry etching processes. The process could be modified to produce holes with negative sidewall slopes for a more aggressive lift-off process (see FIG. 6d. Applicant could also form pillars of photoresist using negative resist processing. To use AZ5214 photoresist as a negative photoresist, applicant post-baked the photoresist at 120° C. for 180 seconds, followed by 2 minutes of post-exposure. Also, we converted Shipley 1805 photoresist to negative photoresist by inserting the samples in ammonia environment at 90° C. for 1 hour, followed by a standard post-exposure step for a negative photoresist for about 2 minutes. FIG. 6(e) shows the top view of the AZ5214 photoresist pillars, while FIG. 6(f) shows the top view of the Shipley 1805 photoresist pillars.

The sizes of the holes, as well as the hole-to-hole distance in the arrays, can be precisely and independently controlled. For example, the hole diameter was controlled with varying exposure time, and the hole-to-hole distance (lattice period) was controlled by different sphere diameters. Uniform HCP arrays of holes with hole diameters of about 300 nm, 500 nm, and 700 nm with lattice periods of about 500, 1000, 2000, and 4000 nanometer were prepared.

Figure 7A:
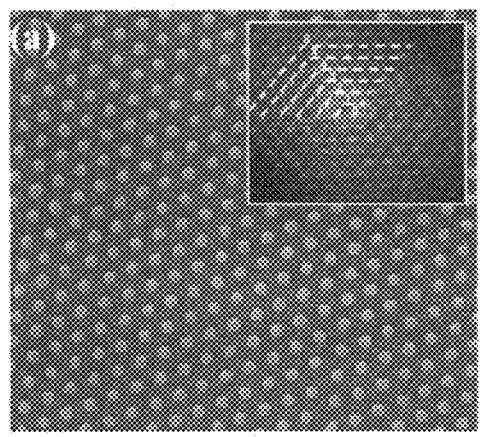
FIG. 7a is a SEM top image of HCP arrays of gold nanopillars with the inset showing the 2D Fourier transform demonstrating excellent coherence of the pillar's position and size.

FIG. 7a shows an example of HCP arrays of gold nanopillars resulted from the lift-off process comprising the steps of using e-beam evaporator to deposit Ti/Au layers with periodic power applied while the top of the evaporator is being cooled with cooling flow water. After that, the sample is placed into N-methyl pyrolidinone liftoff solution with ultrasonication for hours.

Figure 7B:
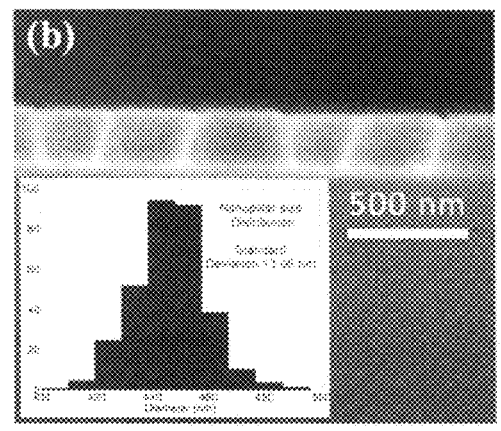
FIG. 7b is a high-resolution side view SEM image of the gold nanopillars with the inset showing the nanopillar size distribution.

The inset shows the 2D Fourier transform of the SEM image of the gold nanopillars. The Fourier image shows narrow hexagonal patterns up to high satellite orders, due to a highly coherent structure. Such coherency is particularly important for the photonic crystal applications. FIG. 7b shows the magnified side-view of the gold pillars. The inset shows the histogram size distribution, showing a standard deviation of about 13 nm in diameter. Unfortunately, this value is limited by applicant's image digitization resolution with ~15 nm per pixel. Higher magnification images show much smaller standard deviation values, while the number of pillars in those images is not statistically large enough.

This Example demonstrates a mask-less sub-wavelength photolithography technique with a potentially high throughput for formation of HCP arrays of deep, sub-wavelength holes and pillars. This method provides accurate and independent control of the diameter and the lattice period of holes/pillars. Using a broadband UV source, applicants have demonstrated highly uniform features that are about 0.6 times the exposure wavelength, while theoretical calculation predicts feature sizes that are about half, for a narrow line UV source down to wavelength=193 nm.

EXAMPLE 2

The basic method flow for this Example is shown in shown in FIGS. 8a; 8b; 8c, 8c'; and 8d, 8d' where FIGS. 8c, 8c' and 8d, 8d' illustrate the processing using a positive and negative photoresist, respectively. Photoresist PR was spun on the substrate SB. Positive photoresist (Shipley 1805) was commercially available from Shipley Co. Negative photoresist (Ma-N 1405) was commercially available from MicroChem Corp. The positive photoresist was treated with developer AZ-300 MIF to render it hydrophilic enough to permit formation of a particle monolayer using an aqueous dispersion of microspheres. A monolayer of micro-spheres SP was formed on top of the photoresist, FIG. 8a, as described in Example 1. Silica micro-spheres of 1 μm diameter were bought from Bangs Lab. The sample with the monolayer of micro-spheres on the photoresist was exposed with a conventional Quintel exposure instrument with broadband wavelength centered about 400 nm, FIG. 8b. The micro-spheres were removed by ultrasonication method in deionized water after exposure. An array of periodic uniform nanoholes NH, FIG. 8c, was formed after the development of positive photoresist using AZ-300 MIF.

In order to produce nano-pillars (nano-posts), Ti/Au layers were deposited by electron beam evaporation into the nanoholes NH of the developed positive photoresist, FIG. 8c, followed by lift-off of the developed photoresist by the above-described NMP liftoff solution, leaving a two-dimensional array of gold nano-pillar or posts GP. On the substrate, FIG. 8d. Similar processes were done with aluminum layer to make a two-dimensional array of aluminum nano-pillars or posts.

For negative photoresist, lift-off of the developed photoresist is used to produce an array of periodic uniform array of photoresist nanopillars NP on the substrate, FIG. 8c', followed by electron beam evaporation of Ti/Au layers to produce a Ti/Au layer perforated with a two-dimensional array of nano-holes GH, FIG. 8d'. The invention thus avoids using the expensive masks in the photolithography method. It also uses a longer wavelength to fabricate the nanopatterns with the same resolutions compared with the standard photolithography.

For negative photoresist, uniform nano-pillars with a strong undercut shape, FIG. 8c', are formed after exposure and development of the photoresist. This undercut shape in the photoresist is important in a liftoff step in subsequent processing, which liftoff step is used to form uniform nanohole arrays in metal/dielectric/magnetic films. In addition, the undercut shape in the photoresist makes the resolution of the exposed regions (i.e. the bottom of the photoresist nanopillar) under 100 nm dimension using standard UV light with a wavelength of 400 nm, which is almost impossible or difficult to achieve using conventional photolithography.

Figure 9A:
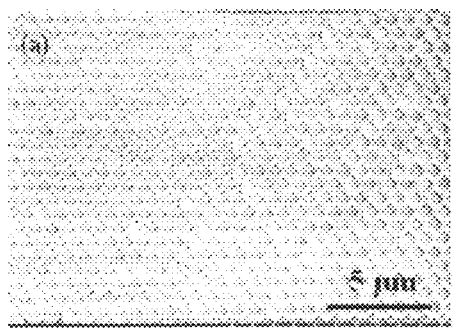
FIG. 9a is a SEM image of the HCP monolayer of silica micro-spheres formed on top of the photoresist.
Figure 9B:
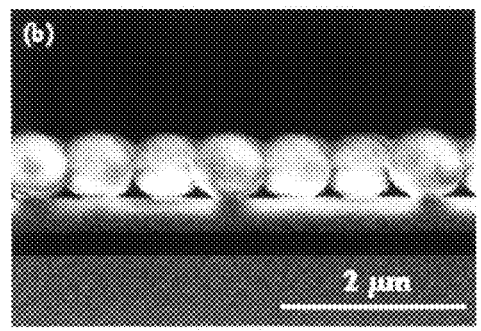
FIG. 9b shows an enlarged view of the micro-spheres.

FIG. 9a is a SEM image of the HCP monolayer of the silica micro-spheres formed on top of the photoresist, and FIG. 9b shows an enlarged view of the micro-spheres which are hexagonal close packed.

Figure 10A:
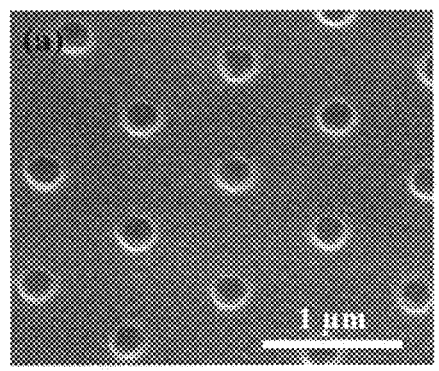
FIG. 10a shows a uniform nanohole array in photoresist with the period of about 1 um.
Figure 10B:
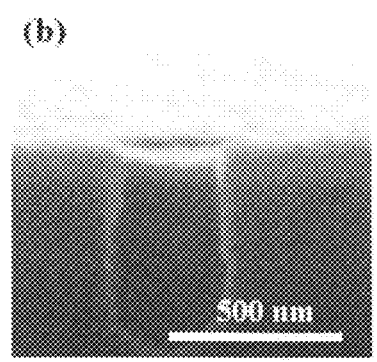
FIG. 10b shows the cross section SEM view of a single nanohole.
Figure 11A:
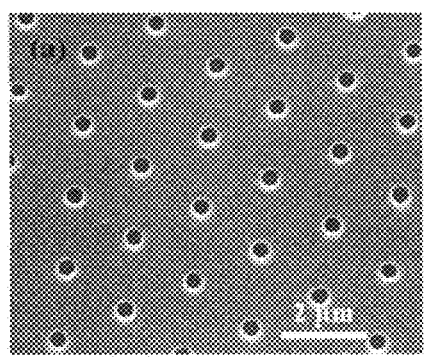
FIG. 11a shows a uniform nanohole array in photoresist with the period of about 2 um.
Figure 11B:
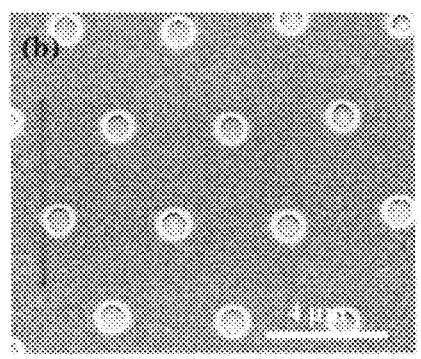
FIG. 11b shows a uniform nanohole array in photoresist with the period of about 4 um.
Figure 12A:
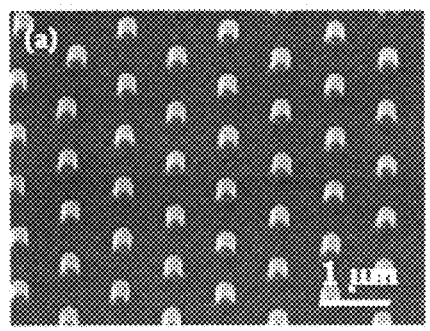
FIG. 12a shows a uniform nanopillar array in negative photoresist with the period of about 1 um.
Figure 12B:
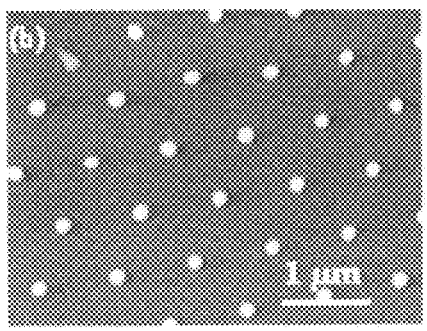
FIG. 12b shows a toppled nano-pillar with a strong undercut in the upper left corner.

Using the UV light with λ centered about 400 nm to expose the positive photoresist with silica micro-spheres, a periodic uniform nanohole array with the diameter of about 250 nm shown in FIG. 10a was produced after development. The period of the array is about 1 μm, which is the same as the diameter of the microspheres used. FIG. 10b is the cross section view of the nanohole. It shows about 1:2 aspect ratio and almost vertical sidewall. It can be further used for lift-off and etching process. As can be seen, at the bottom of the nanohole the diameter is even smaller and it can be potentially used for generating smaller features by etching-transfer the nanopatterns. To show the tunable ability of this method embodiment, different diameters of silica micro-spheres were used to produce the nanohole arrays. Applicant generated the nanoholes of almost the same sizes but with different periods. For example, FIGS. 11a and 11b show the nanohole arrays with the periods of about 2 and 4 μm and the nanohole sizes are around 300 nm. Using the negative photoresist in the method embodiment, a periodic uniform array of nanopillars was produced. The nanopillars can also be tuned with different sizes and sidewalls in the cross section. FIGS. 12a and 12b show an array of periodic uniform nanopillars of developed photoresist with different sizes and cross section shapes. With controlled parameters, the size of the nanopillars in FIG. 12a is about 250 nm and the sidewall is almost vertical; the nanopillars in FIG. 12b have the size of about 200 nm and it shows a very strong undercut shape. As can be seen, the nanopillar fallen down at the upper left corner of FIG. 12b shows a clear undercut cross-section shape of the pillar where the diameter of the pillar is smaller at the bottom than at the top of the nano-pillar.

Figure 13A:
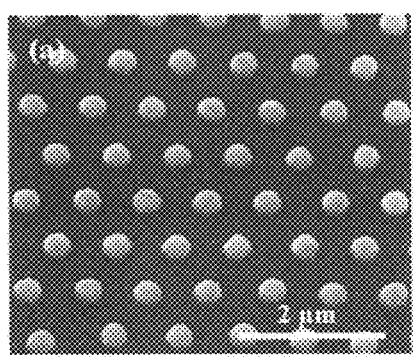
Figure 13B:
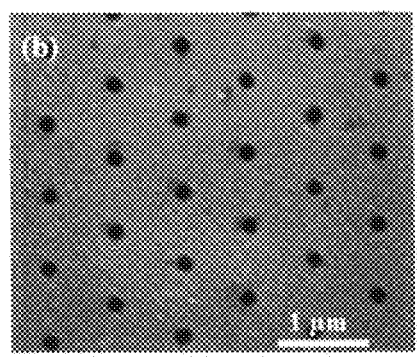
FIG. 13b shows an array of hexagonally distributed uniform holes perforated in Ti/Au films.
Figure 14A:
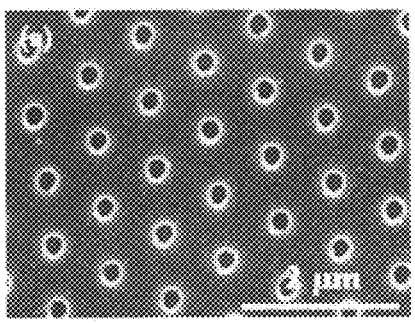
FIG. 14a shows an array of hexagonally distributed uniform nanoholes perforated in aluminum layer, while FIG. 14b uses RIE to transfer the nanoholes patterns in the $SiO_2$ film which is located below the mask (top layer).

Using the nanoholes and nanopillars produced by this embodiment, applicant successfully produced a uniform array of gold nanoposts and nanoholes by using e-beam evaporation to deposit a layer of Ti (5 nm) and a subsequent layer of Au with a slow evaporation rate of (0.2 nm/sec), and using N-methyl pyrolidinone liftoff solution with ultrasonication to remove the photoresist and obtain the nano-patterns. FIG. 13a shows an array of hexagonally distributed nanoposts of Ti/Au and FIG. 13b shows the array of hexagonally distributed nanoholes perforated in Ti/Au films. The diameter of nanoposts and nanoholes in FIGS. 13a and 13b are about 300 nm and 180 nm separately, and the periods are both about 1 um. All these parameters can be tuned since the method is a tunable process. Similar results can also be obtained with the use of aluminum, as shown in FIG. 14a. The diameter of the nanoholes perforated in the Al film is about 250 nm. The edge of the nanoholes is a little rough because aluminum deposited by e-beam evaporation is not as uniform as other metals.

Figure 14B:
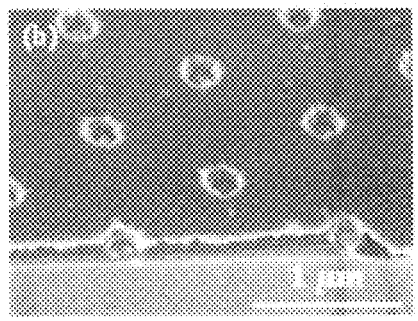

Besides lift-off process, using Reactive Ion Etching (RIE) and the metal layer with the nanoholes as mask, applicant also produced a similar nanohole array in an underlying dielectric layer of silicon dioxide ($SiO_2$) film in FIG. 14b. It is a tilted cross section image. There are two layers of materials on top of the lowermost substrate in the figure, which are $SiO_2$ and Al thin films. The size of the nanohole in the silica layer is almost the same as the one in the metal film.

This Example demonstrates that a large area of highly uniform periodic nanoholes or nanoposts can be generated by utilizing a monolayer of hexagonally close packed (HCP) silica microspheres as super-lenses on top of photoresist. The size of the nanopatterns generated is almost independent of the sphere sizes and hence extremely uniform patterns can be obtained. The method can produce hexagonally packed arrays of holes of sub-250 nm size in positive photoresist using a conventional exposure system with a broadband UV source centered at 400 nm. Fabrication of a large area of highly uniform gold nanoholes (~180 nm) and nanoposts (~300 nm) array with the period of 1 μm by the combination of lift-off and nanosphere lithography was also demonstrated. Similar structures have been shown with gold, aluminum, and silicon dioxide layer. The period and size of the structures can also be tuned by changing proper parameters. The technique applying self-assembled and focusing properties of micro-/nano-spheres into photolithography establishes a new maskless photolithography technique, allowing rapid and economical creation of large areas of periodic nanostructures with a high throughput.

The combination of nanosphere lithography with other standard processes such as lift-off and etching is advantageous to permit the fabrication of nanopillars and nanoholes in various materials. Applying the lift-off with the nanoholes in positive photoresist or nanopillars of negative photoresist can produce a large area of periodic uniform nanoposts on or nanoholes in metal, semiconductor, or insulator films. Different metals, dielectrics or multi-layer stacks with the nanoholes perforated can also be generated.

Using a broadband wavelength light source centered around 400 nm, the method can produce the nanoholes of the diameter of about 250 nm in positive photoresist and the nanopillars of the diameter of about 200 nm with negative photoresist. The nanopillars generated have a high aspect ratio and under-cut shape for lift-off.

Although the invention has been described above with respect to certain embodiments those skilled in the art will appreciate that the invention is not limited thereto and can be changed, modified and the like within the scope of the pending claims.

I claim:

1. A method of patterning a photoresist, comprising:
   (a) disposing a two-dimensional array of substantially spherical particles on a photoresist layer on a substrate;
   (b) illuminating the particles on the photoresist layer while focusing the illumination through the particles to respective regions of the photoresist layer beneath the particles with each region forming a sub-wavelength pillar having a diameter dimension that is less than the wavelength of the illumination; and (c) developing the photoresist,
wherein the photoresist layer comprises a negative photoresist so that developing of the photoresist leaves a two-dimensional array of micro- or nano-pillars on the developed photoresist.

2. The method of claim 1 including removing the particles before or after developing the photoresist layer.

3. The method of claim 1 wherein the micro- or nano-pillars have an undercut shape.

4. The method of claim 1 wherein the particles have a diameter in the range of 0.5 microns to 5 microns.

5. The method of claim 1 wherein the particles comprise silica or polystyrene.

6. The method of claim 1 wherein the illumination comprises UV light.

7. The method of claim 6 wherein the UV light has a wavelength of 200 to 500 nm.

8. The method of claim 1 including self assembling the particles on the photoresist.

9. The method of claim 1 wherein the two-dimensional array of sub-wavelength features has a periodicity corresponding substantially to the particle array.

10. The method of claim 1 including depositing a material on the developed photoresist layer and then removing the developed photoresist layer.

11. The method of claim 1 wherein the particles are disposed in a hexagonal close packed array.

* * * * *

UNITED STATES PATENT AND TRADEMARK OFFICE
CERTIFICATE OF CORRECTION

PATENT NO. : 8,445,188 B2  
APPLICATION NO. : 12/584897  
DATED : May 21, 2013  
INVENTOR(S) : Hooman Mohseni Page 1 of 1

It is certified that error appears in the above-identified patent and that said Letters Patent is hereby corrected as shown below:

On the Title Page:
Item (73): "Assignee: National Science Foundation, Arlington, VA (US)" should read
--Assignee: Northwestern University, Evanston, IL (US)--.

Signed and Sealed this
Fifteenth Day of July, 2014

Michelle K. Lee
*Deputy Director of the United States Patent and Trademark Office*